US010950167B1

(12) United States Patent
Chan et al.

(10) Patent No.: US 10,950,167 B1
(45) Date of Patent: Mar. 16, 2021

(54) LED DISPLAY WITH ELECTROLUMINESCENT COMPONENTS

(71) Applicant: Solomon Systech (Shenzhen) Limited, Shenzhen (CN)

(72) Inventors: Wing Chi Stephen Chan, Hong Kong (HK); Chi Wai Lee, Hong Kong (HK); Pie Chih Ke, Hong Kong (HK); Chun Hung Lai, Hong Kong (HK)

(73) Assignee: Solomon Systech (Shenzhen) Limited, Shenzhen (CN)

( * ) Notice: Subject to any disclaimer, the term of this patent is extended or adjusted under 35 U.S.C. 154(b) by 0 days.

(21) Appl. No.: 16/656,538

(22) Filed: Oct. 17, 2019

(51) Int. Cl.
| *G09G 5/02* | (2006.01) |
| *G09G 3/32* | (2016.01) |
| *H01L 25/075* | (2006.01) |
| *G09G 3/20* | (2006.01) |
| *G09G 3/3233* | (2016.01) |
| *G09G 3/3258* | (2016.01) |

(52) U.S. Cl.
CPC .............. *G09G 3/32* (2013.01); *G09G 3/2003* (2013.01); *G09G 3/3233* (2013.01); *G09G 3/3258* (2013.01); *H01L 25/0753* (2013.01); *G09G 2300/0426* (2013.01); *G09G 2300/06* (2013.01); *G09G 2310/0251* (2013.01); *G09G 2320/0242* (2013.01)

(58) Field of Classification Search
CPC .......... G09G 3/30; G09G 3/32; G09G 3/3233; G09G 3/3258; G09G 3/2003
See application file for complete search history.

(56) References Cited

U.S. PATENT DOCUMENTS

| 9,818,980 | B2 * | 11/2017 | Yang | ................... | H01L 51/5256 |
| 10,777,101 | B2 * | 9/2020 | Park | ..................... | G06F 1/1652 |
| 2018/0279444 | A1 * | 9/2018 | Rye | ........................ | H05B 33/10 |
| 2019/0339741 | A1 * | 11/2019 | Park | ..................... | G06F 1/1652 |
| 2020/0173949 | A1 * | 6/2020 | Lee | ......................... | G06F 3/0446 |
| 2020/0175900 | A1 * | 6/2020 | Han | .................... | H01L 51/0031 |

* cited by examiner

*Primary Examiner* — Vijay Shankar
(74) *Attorney, Agent, or Firm* — Idea Intellectual Limited; Margaret A. Burke; Sam T. Yip

(57) ABSTRACT

A light-emitting diode (LED) includes a first electroluminescent (EL) component, a second EL component, a first segment electrode, a second segment electrode, and a first common electrode. The first segment electrode is electrically connected to the first EL component. The second segment electrode is electrically connected to the second EL component. The first common electrode has a first branch and a second branch which extend along a first direction and are arranged in a second direction different than the first direction. The first branch is located between the second branch and either of the first and second EL components, and the first and second branches are electrically connected to the first and second EL components, respectively.

20 Claims, 8 Drawing Sheets

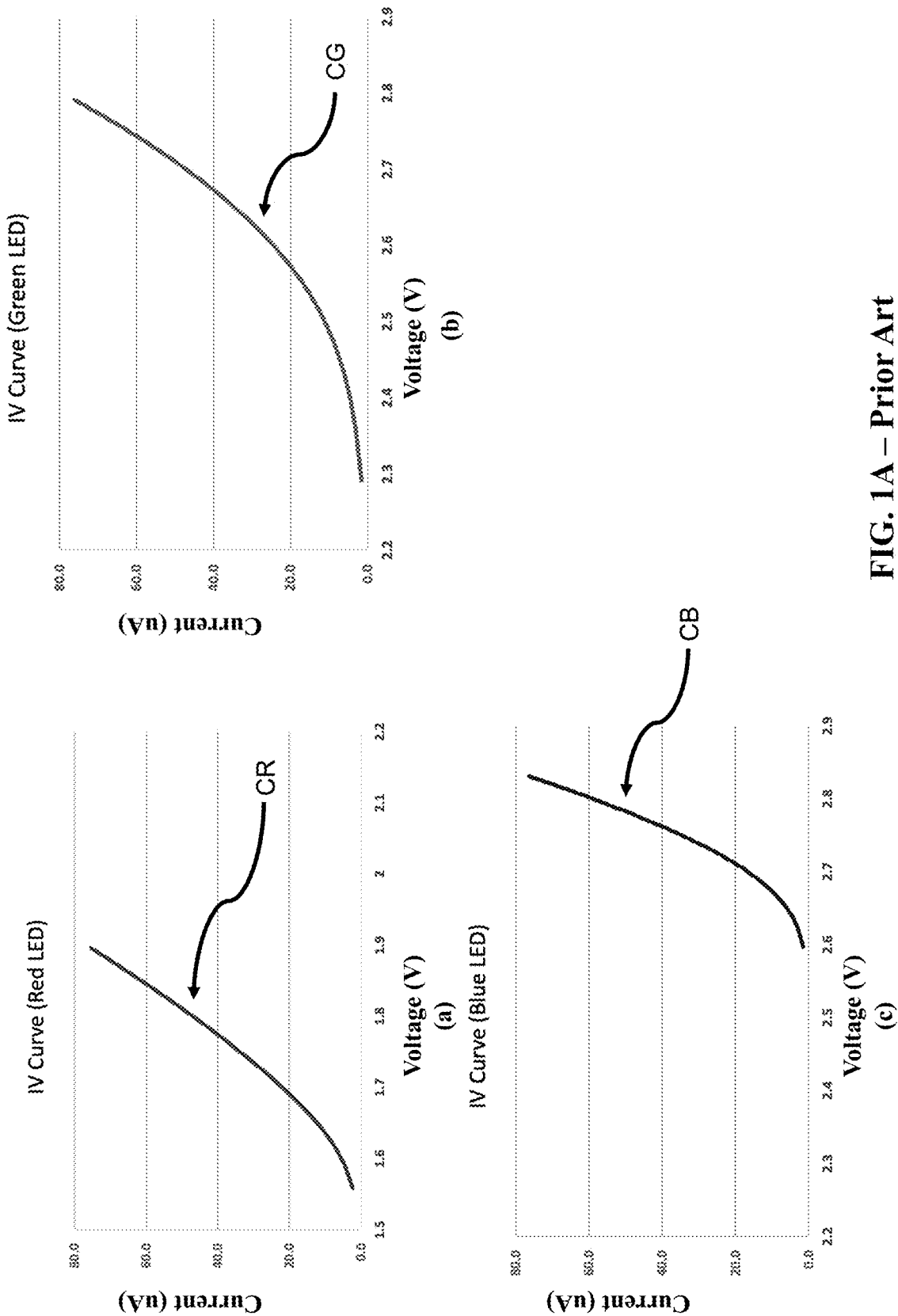
FIG. 1A – Prior Art

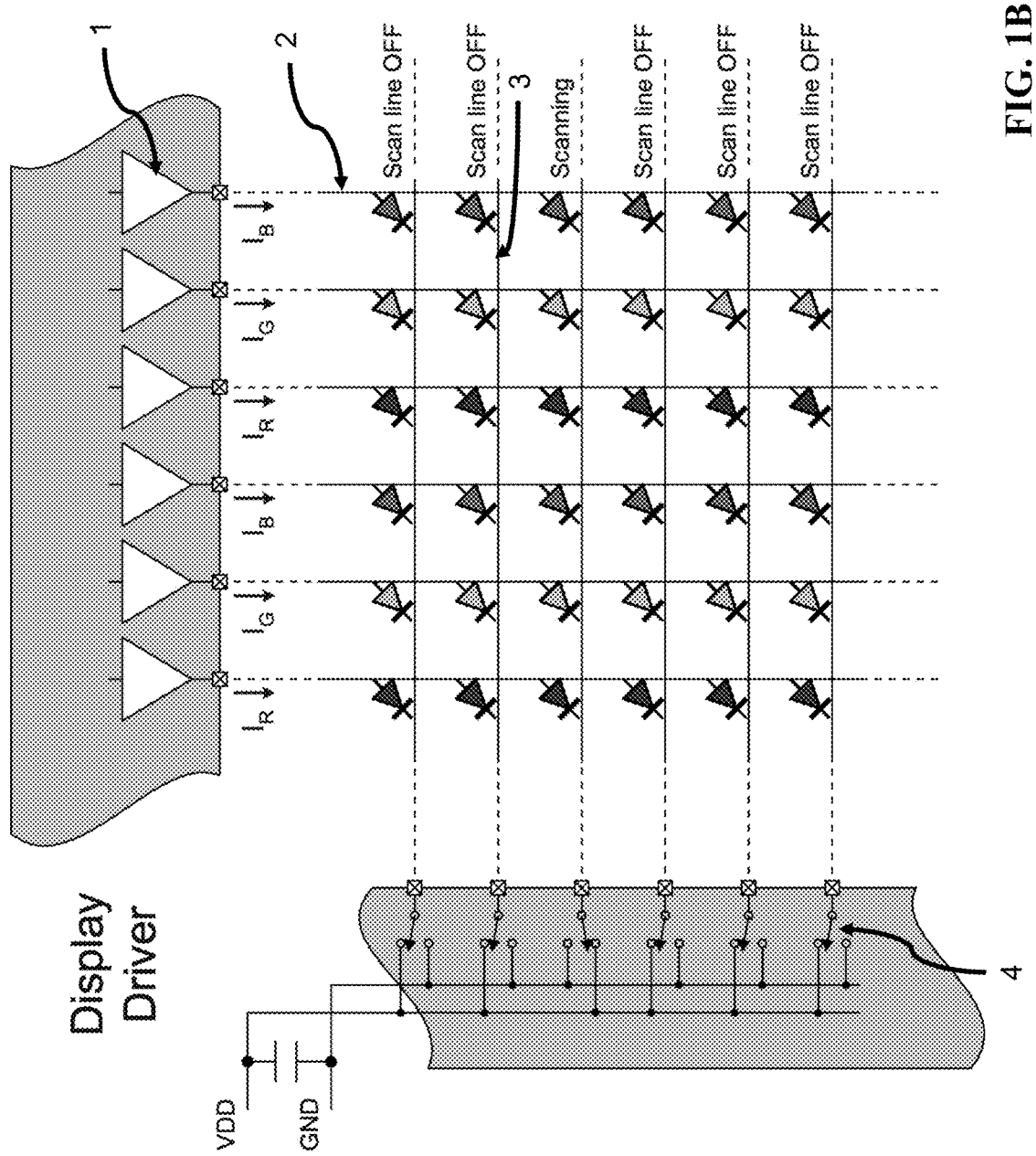
FIG. 1B – Prior Art

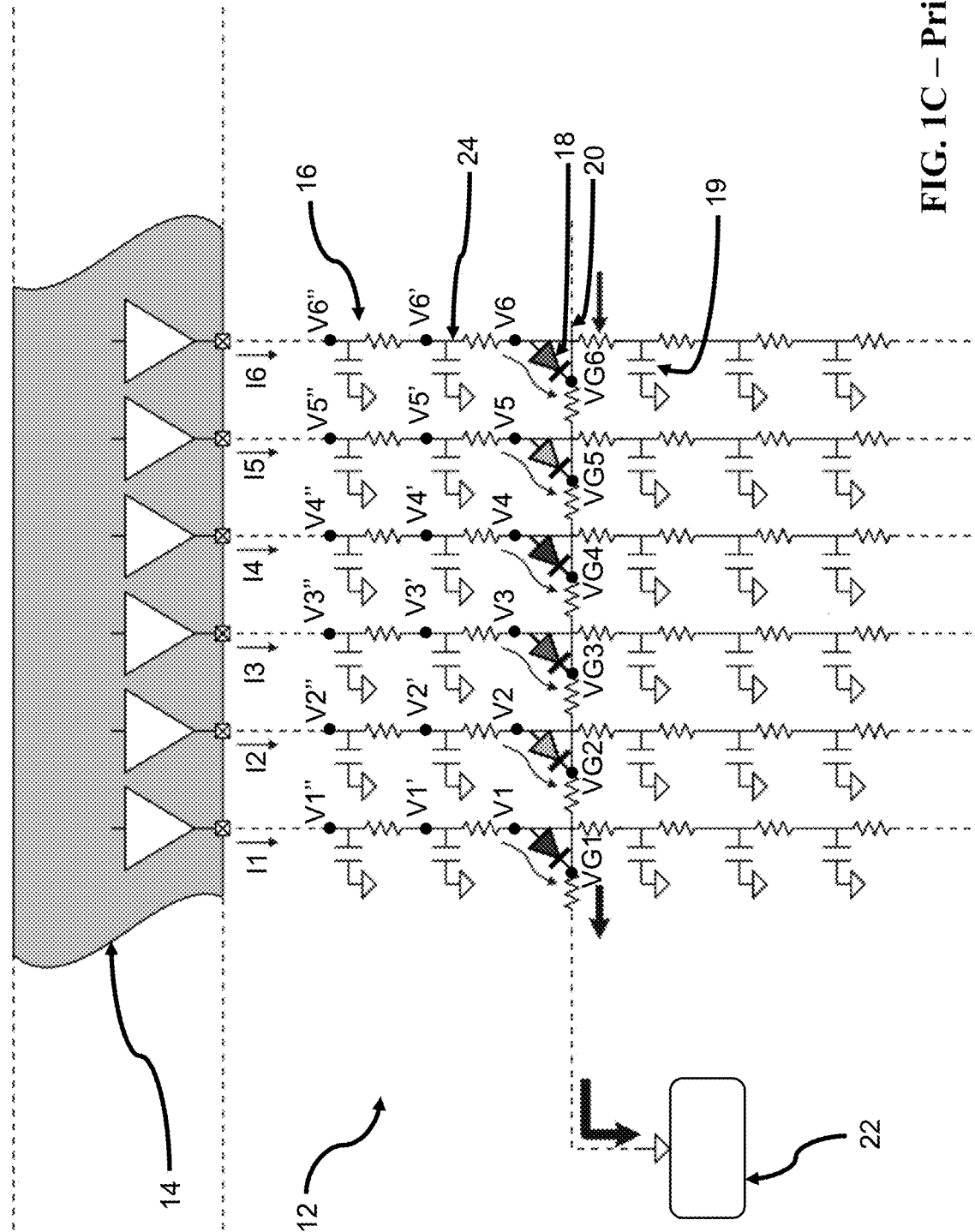
FIG. 1C – Prior Art

LED DISPLAY WITH ELECTROLUMINESCENT COMPONENTS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to multicolor light-emitting diodes (LED) display technology, and particularly to methods and apparatuses for signal driving RGB LED displays.

BACKGROUND OF THE INVENTION

Light-emitting diodes (LEDs) are now common devices that are widely applied to commercial usages. As a light source, LEDs have plenty of advantages, such as fast switching, low energy consumption, and long lifetime. Accordingly, conventional light sources have gradually been replaced by the LED light sources. In addition to being a light source, LED technology is being applied in the consumer and industrial electronic display fields. In recent years, the micro-LED display technology has been developed by using micro-LEDs as pixels of a display panel.

In such a LED display panel, LEDs that can provide different colors, typically in the colors of red, green, and blue, are arranged into arrays connected by electrodes. However, due to the LEDs of different colors having different electrical response characteristics (as shown in FIG. 1A illustrating the current-voltage (IV) curves of RGB LEDs, in which curves CR, CG, and CB correspond with red, green, and blue LEDs), the brightness outputs are different when the LEDs are driven by the same amount of driving currents. As such, red, green, and blue LEDs are often driven by predefined driving currents of different amounts, and red LEDs are usually driven by currents higher than those for the green and blue LEDs.

FIG. 1B illustrates an exemplary electrical element arrangement of a conventional display with a passive matrix. The display driver comprises a plurality of signal drivers 1, each current-driving a signal line 2, which can be a single segment electrode, connecting the array of LEDs of the same color. Each of the LEDs is also connected to a scanning electrode 3; and each scanning electrode 3 is connected a switch 4 that switches between voltage source VDD and voltage ground GND. Display scanning is done by time multiplexing. At any time instant, only one scanning electrode 3 is active, that is, being switched to connect to voltage ground GND allowing the corresponding signal driver 1 to drive current through the multicolor LEDs of that particular row. All other inactive scanning electrodes, at that particular time instant, are switched to connected to voltage source VDD, making the corresponding LEDs reverse bias so as to ensure no current pass through, thus not emitting light.

However, the signal lines 2 almost always have some amount of resistance and capacitance. The scanning electrodes 3 also have some amount of resistance; and that the presence of even a trace amount of resistance in the scanning electrodes 3 affects greatly the amount of currents being driven through the LEDs since the scanning electrodes 3 collect all currents from the signal lines 2. As such, even though the signal drivers 1 are driving the respective predefined driving currents on to the signal lines 2 to the RGB LEDs, the RGB LEDs are not receiving the exact predefined driving currents, causing impreciseness in the light intensities. The visual effect is that the white balance is not correct. Furthermore, this white balance shift is image dependent, and it is not a static white balance shift at a particular location on the display panel. As a result, image quality of the display suffers.

SUMMARY OF THE INVENTION

To address the aforementioned shortcoming, the present invention provides an apparatus to be used in a LED display panel that includes a first electroluminescent (EL) component, a second EL component, a first segment electrode, a second segment electrode, and a first common electrode. The first segment electrode is electrically connected to the first EL component. The second segment electrode is electrically connected to the second EL component. The first common electrode has a first branch and a second branch which extend along a first direction and are arranged in a second direction different than the first direction. The first branch is located between the second branch and either of the first and second EL components, and the first and second branches are electrically connected to the first and second EL components, respectively.

To further improve the image quality of the LED display panel, the present invention also provides a method of pre-charging the EL components with voltages of different predefined values corresponding to the EL components' electrical response characteristics.

In accordance to one various embodiments of the present invention, the apparatus further comprises a plurality of first EL components, a plurality of second EL components, a first segment electrode, a second segment electrode, and a plurality of common electrodes. The first and second EL components collectively form an EL array with K number of rows. The first segment electrode extends to electrically connect the first EL components. The second segment electrode extends to electrically connect the second EL components. The common electrodes are alternately arranged with the rows of the EL array, and each of the common electrodes has a first branch and a second branch. The first and second branches of the Nth common electrode of the common electrodes are electrically connected to the first and second EL components in the Nth row of the EL array respectively, and the first and second branches of the N+1th common electrode of the common electrodes are electrically connected to the first and second EL components in the N+1th row of the EL array respectively, in which N is a positive integer less than K.

By the arrangement above, different color EL components in the same row of the EL array are connected to different branches of the same common electrode, and thus the different color EL components have their corresponding separate common return paths respectively. Accordingly, when a display scanning starts, the arrangement prevents the different color EL components from affecting each other during a voltage or current drive stage of the display scanning. As such, currents received by the different color EL components in the same row of the EL array can be substantially maintained at the respective predefined currents, thereby minimizing white balance shift. Moreover, with individual controls over the different color LEDs, it enables a circuit layout design that can further minimize white balance shift.

BRIEF DESCRIPTION OF THE DRAWINGS

Embodiments of the invention are described in more detail hereinafter with reference to the drawings, in which:

FIG. 1A illustrates the current-voltage (IV) curves of red, green, and blue LEDs;

FIG. 1B illustrates an exemplary electrical element arrangement of a conventional display with a passive matrix;

FIG. 1C illustrates an exemplary circuit model used in a conventional display with a passive matrix;

DETAILED DESCRIPTION

Figure 1D:
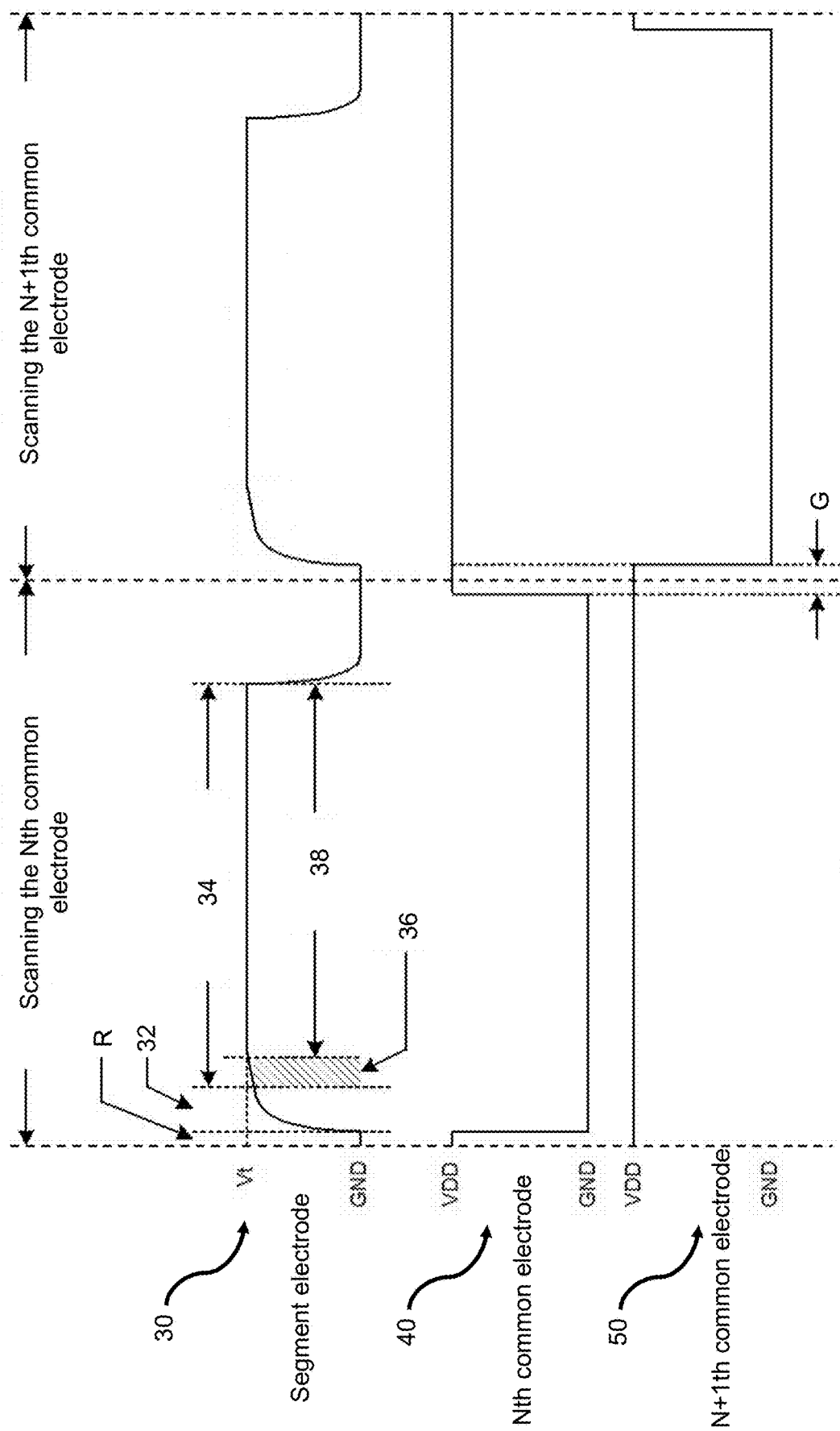
FIG. 1D illustrates a timing diagram of the display scanning with respect to the segment electrodes and the common electrodes of FIG. 1C.

In the following description, methods and apparatuses being used in LED displays and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

FIG. 1C illustrates a circuit model 12 used in a conventional display 10 under a passive matrix configuration. As shown in FIG. 1C, a display 10 includes a circuit model 12 having a signal driver 14 (also known as segment driver) and an electroluminescent (EL) array 16 driven by the signal driver 14. The EL array 16 can be formed by arranging a plurality of light emitting diodes 18 (LEDs) with K rows and L columns. The LEDs 18 in the same row are electrically connected to the same common electrode 20 (also referred to as scanning electrode), which electrically connected to a scanning driver 22 (also referred to as common driver); and the LEDs 18 in the same column are electrically connected to the same signal line (or segment electrode) 24, which electrically connected to the signal driver 14. As such, the LEDs 18 of the EL array 16 can be addressed by a passive matrix.

During a display operation to the display 10, a display scanning is performed by a time multiplexing technique. In order to better understand display scanning, in the exemplary illustration of FIG. 1C, only the common electrode in the $3^{rd}$ row is shown, and the common electrodes in the other rows are omitted. During display scanning, the common electrodes are scanned respectively according to different scanning periods, and thus there can only be one common electrode in use at any time instant. The common electrode 20 in the $3^{rd}$ row is selected by the scanning driver 22, so to allow the signal driver 14 to drive currents I1, I2, I3, I4, I5, and I6 passing through the LEDs 18 in the 3rd row, forward biasing these LEDs 18.

For the common electrodes not selected (e.g., the common electrodes in the $1^{st}$, $2^{nd}$, $4^{th}$, $5^{th}$, and $6^{th}$ rows) during the same time period, these inactive common electrodes are electrically connected to a specific voltage source VDD such that the corresponding LEDs (e.g., the LEDs in the $1^{st}$, $2^{nd}$, $4^{th}$, $5^{th}$, and $6^{th}$ rows) are reverse biased, and therefore the currents I1-I6 from the signal driver 14 do not pass through the LEDs that are electrically connected to the unselected common electrodes. Moreover, since there is no current passing through the LEDs that are in a reverse bias state, remaining as electrical residue is the p-n junction capacitance. Accordingly, in the exemplary illustration of FIG. 1C, capacitors 19 are illustrated to represent the LEDs in a reverse bias state.

The afore-described display scanning operation may include a current drive stage. During the current drive stage, certain portion of current outputted from the signal driver 14 is absorbed by the capacitors 19 before the LEDs 18 in the $3^{rd}$ row are turned on (emit light), which results in charging the capacitors 19. Each of the segment electrodes 24 and current(s) outputted from the signal driver 14 flow into the LEDs through these segment electrodes. As the capacitors 19 being charged, voltages of the segment electrodes increase until the LEDs 18 in the $3^{rd}$ row turn on. At the moment of turning on the LEDs 18 in the $3^{rd}$ row, the capacitors 19 at each node reach their equilibrium voltage levels. Until then, current(s) outputted from the signal driver 14 flow through the LEDs 18 in the $3^{rd}$ row.

FIG. 1D illustrates a timing diagram of the display scanning with respect to the segment electrodes and the common electrodes of FIG. 1C. Shown in FIG. 1D are a waveform 30 of voltage versus time for a segment electrode, a waveform 40 of voltage versus time for a common electrode in the $N^{th}$ row, and a waveform 50 of voltage versus time for a common electrode in the $N+1^{th}$ row.

The display scanning for a segment electrode driven by a signal driver per one scanning period can be divided into at least two stages: a voltage drive stage 32 and a current drive stage 34 in sequence. After the segment electrode driven is reset by shorting to voltage ground GND during an interval R, the voltage drive stage 32 starts. The voltage drive stage 32 is also referred to as a called pre-charge stage. The signal driver drives the segment electrode to predefined voltage level in this stage. The predefined voltage level is slightly below threshold voltage $V_t$ of the corresponding LED, such that the LED remains turned off. The threshold voltage $V_t$ is dependent on the type of the LED. For example, red, green, and blue LEDs have different threshold voltages. The current drive stage 34 follows the voltage drive stage 32. In the current drive stage 34, brightness of the individual LED is controlled by pulse width modulation (PWM). Before the LED is turned on to emit light, certain amount of electric charge is needed to pump up the voltage to reach the threshold voltage $V_t$, because there are charged capacitors (e.g., the capacitors 19 illustrated to represent the LEDs in a reverse bias state in FIG. 1C) electrically connected to each segment electrode. That is, during a time interval 36 in the beginning of the current drive stage 34, no light is emitted from the LED. After time interval 36 lapses, the LED emits light in time interval 38. In addition, the $N^{th}$ and $N+1^{th}$ common electrodes are switched between an disabling voltage VDD and an enabling voltage ground GND according to the scanning periods, in which the enabling-disabling voltage intervals that the $N^{th}$ and $N+1^{th}$ common electrodes output are not overlapped, and separated by a time gap G.

Referring to FIG. 1C again. In the current drive stage (e.g., the current drive stage 34 in FIG. 1D), when the capacitors 19 are charged to the equilibrium voltage levels, the currents I1-I6 outputted from the signal driver 14 flow through the LEDs 18 in the 3rd row and are collected by the 3rd row common electrode 20. In this regard, since the common electrode 20 has resistance and may collect currents from the segment electrodes 24, voltages at nodes VG1, VG2, VG3, VG4, VG5, and VG6 of the common electrode 20 may be higher than the system ground voltage (e.g., a ground voltage of the display 10). Further, the further the nodes VG1-VG6 that are away from the scanning driver 22, the higher their voltages, such that VG6>VG5>VG4>VG3>VG2>VG1. In addition, with respect to each of the currents I1-I6 from the signal driver 14, voltage drop along the corresponding segment electrode 24 may result in gradual decrease in voltages at different nodes of the same segment electrode 24. For example, voltages at nodes V1", V2", V3", V4", V5", V6" in the Pt row are higher than voltages at nodes V1', V2', V3', V4', V5', V6' in the $2^{nd}$ row, respectively. Similarly, the voltages at the nodes V1'-V6' in the $2^{nd}$ row are higher than voltages at nodes V1, V2, V3, V4, V5, V6 in the 3rd row, respectively. On the contrary, since there is no current flowing beyond the LEDs 18 in the $3^{rd}$ row, voltages at nodes of the segment electrodes 24 beyond the $3^{rd}$ row may have the same voltage level.

In a multicolor LED display, the different colors in the color spectrum are provided using combinations of different intensities of lights emitted by the red, green, and blue LEDs. Different color LEDs have different electrical response characteristics, such as different current-voltage (IV) curve and transient response characteristics, hence different driving currents are required. For example, in order to make the red, green, and blue LEDs output the same brightness, the driving current for the red LED is higher than the driving currents for green and blue LEDs. As discussed previously, because voltages at different nodes of the same common electrode further away from a scanning driver are higher, the currents received by the LEDs in the same row may not correspond to predefined values even though the signal driver outputs the currents for red, green, and blue LEDs at the predefined values.

The brightness of a LED as perceived by human is equal to the total electrical charge passing through the LED during a predefined period of time (e.g., 1 second). The total electrical charge is equal to the integration of driving current over the predefined period. Hence, 1 A of driving current for 1 sec means 1 C (Coulomb) of electrical charge is passing through the LED. In a PWM system, if 50% of the time having 1 A driving current then 0.5 C of electrical charge passes through the LED during a 1 second period.

Referring to FIG. 1D. The no electrical charge through LED duration 36 is different at different nodes even the current drive stage duration 34 is the same for all nodes. For example, V6">V3", V6'>V3' and V6>V3 as shown in FIG. 1C. Hence, the total electrical charge absorbed by the junction capacitors of column 6 is greater that the corresponding junction capacitors of column 3. Therefore, duration 36 is longer for column 6 when compare with column 3. In other words, column 3 LEDs are brighter than column 6 in general. That is, if green and blue LEDs are arranged between two red LEDs in the same row, with respect to the red LED that is closer to the scanning driver, the received actual current value depends how much currents are passing through the green and blue LEDs. This causes undesirable visual effects along with white balance shifts occurring across the display panel. Moreover, due to different precharge voltages required for red, green, and blue LEDs, connecting the red, green, and blue LEDs to the same current path results in the temporal white balance shifts as well.

Figure 2A:
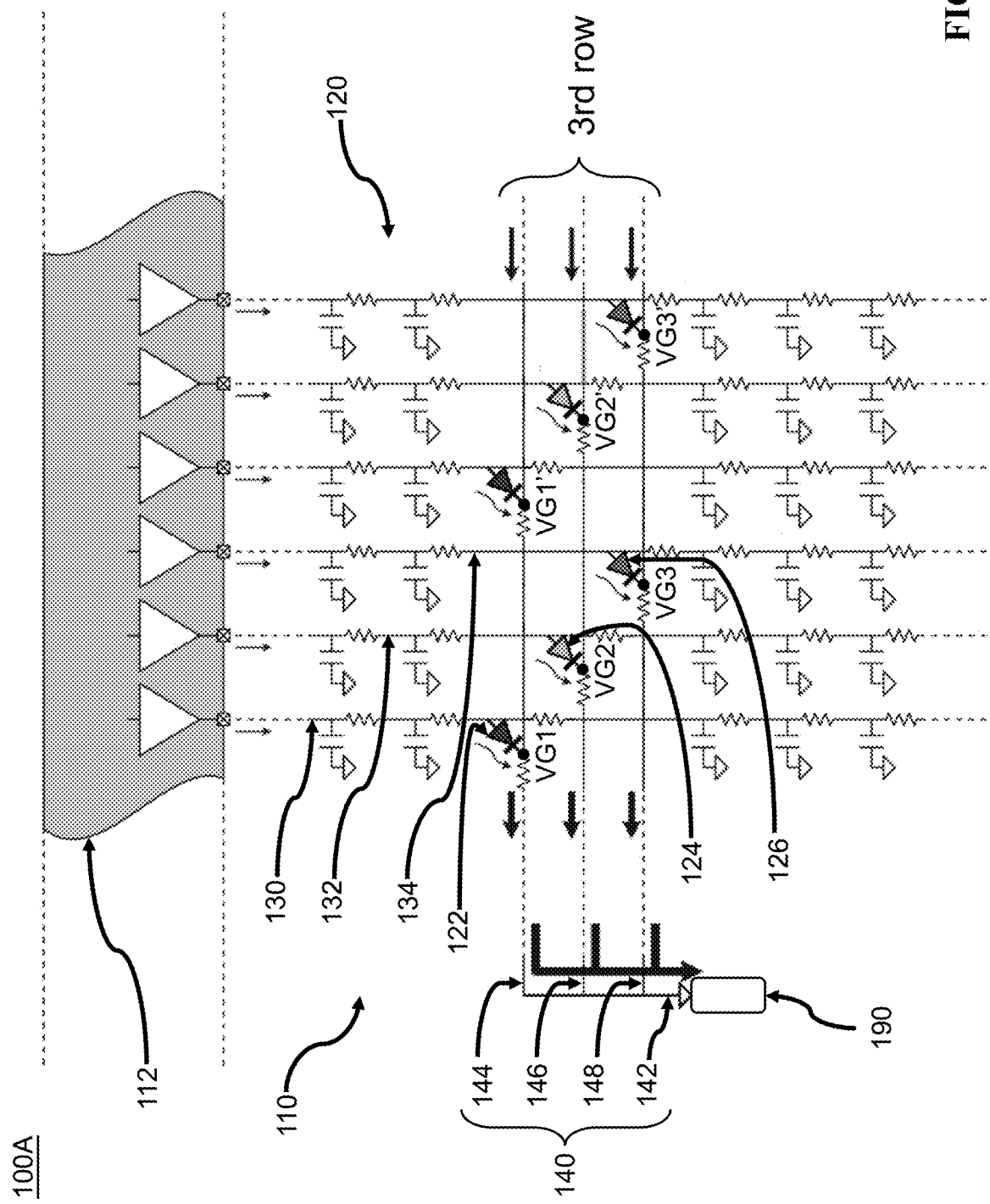
FIG. 2A illustrates an exemplary circuit model used in a passive matrix display in accordance with a first embodiment of the present invention.
Figure 2B:
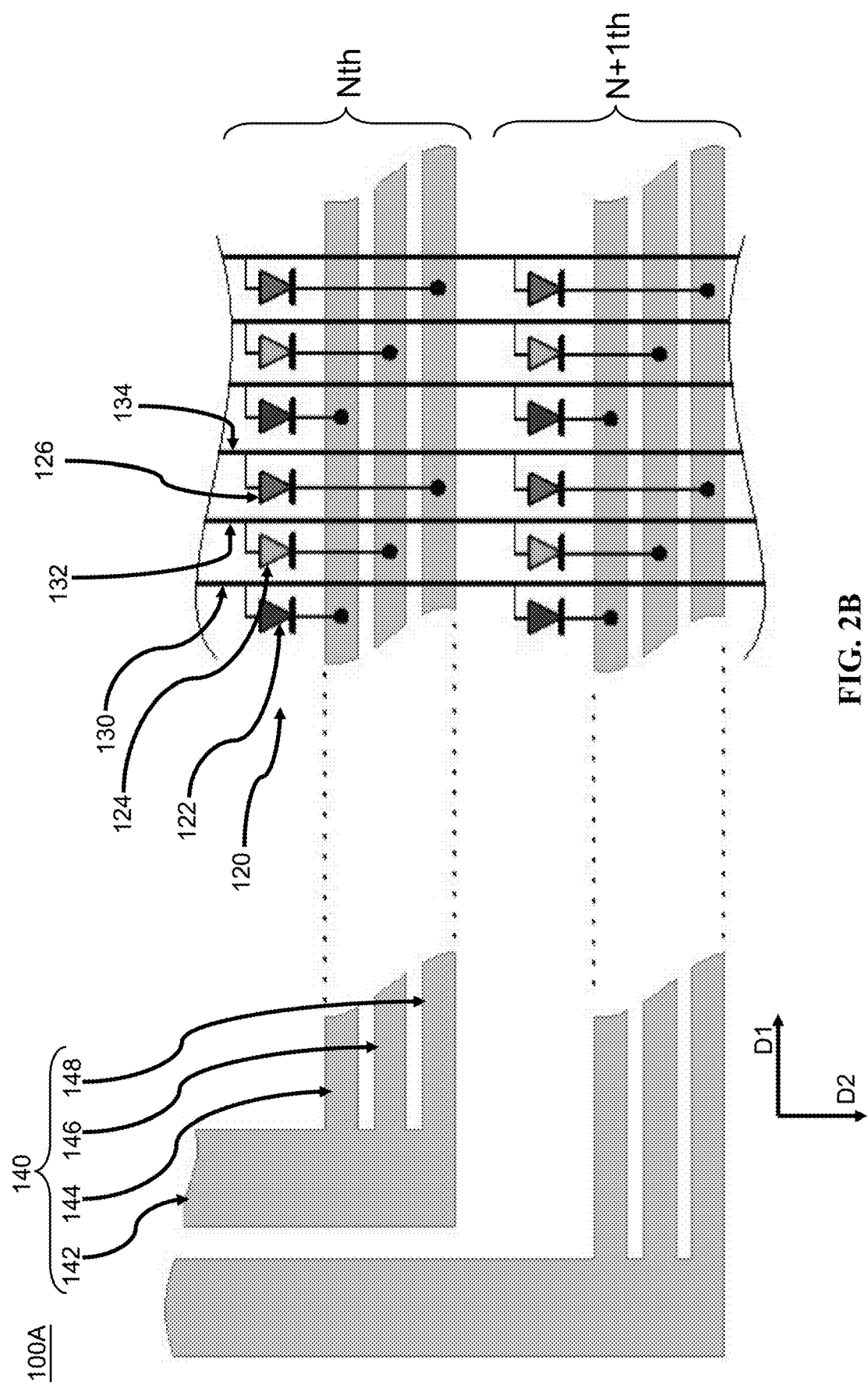
FIG. 2B illustrates a structural diagram of EL components and corresponding common electrodes in continuous two row of FIG. 2A.

FIG. 2A illustrates a circuit model 110 used in a passive matrix display 100A in accordance with a first embodiment of a first aspect of the present invention. In the exemplary illustration of FIG. 2A, a common electrode 140 in the 3rd row is illustrated, and common electrodes in the other rows are omitted. FIG. 2B illustrates a structural diagram of EL components and corresponding common electrodes 140 in continuous two row of FIG. 2A. The passive matrix display 100A includes a signal driver 112, an EL array 120, a plurality of first segment electrodes 130, a plurality of second segment electrodes 132, a plurality of third segment electrodes 134, a plurality of common electrode 140, and a scanning driver 190.

The EL array 120 with K rows and L columns is formed by arranging first components 122, second components 124, and third EL components 126. The first, second, and third EL components 122, 124, and 126 are configured to provide light in first, second, and third wavebands which are different from each other. In various embodiments, the first, second, and third wavebands are selected from red, green, and blue wavebands. Such configuration for the first, second, and third EL components 122, 124, and 126 can be achieved by using red, green, and blue LEDs. In one exemplary embodiment, each of the red, green, and blue LEDs has a dimension less than 0.1 mm.

In the exemplary illustration of FIG. 2A, the first EL components 122 are arranged in the 1st and 4th columns of the EL array 120; the second EL components 124 are arranged in the 2nd and 5th columns of the EL array 120; and the third EL components 126 are arranged in the 3rd and 6th columns of the EL array 120. The first, second, and third EL components 122, 124, and 126 can be alternately arranged in the same row. In embodiments involving the first, second, and third EL components 122, 124, and 126 being different types of LEDs, in any one row of the EL array 120, the LEDs with different colors may be arranged in sequence, such as a red LED, followed by a green LED, a blue LED, and then a red LED again.

Each of the first segment electrodes 130 extends to electrically connect the first EL components 122 in the same column. For example, the two first segment electrodes 130 are electrically connected to the first EL components 122 in the 1st and 4th columns, respectively. Similarly, each of the second segment electrodes 132 extends to electrically connect the second EL components 124 in the same column respectively, and each of the third segment electrodes 134 extends to electrically connect the third EL components 126 in the same column.

The common electrodes 140 are alternately arranged with the rows of the EL array 120, as shown in FIG. 2B. In the exemplary illustration of FIG. 2B, from top to bottom, there are a combination of the first, second, and third EL components 122, 124, and 126 in the $N^{th}$ row, the common electrode 140 in the $N^{th}$ row, a combination of the first, second, and third EL components 122, 124, and 126 in the $N+1^{th}$ row, and the common electrode 140 in the $N+1^{th}$ row, in which N is a positive integer less than K.

Again referring to FIG. 2B. Each of the common electrodes 140 has a body 142, a first branch 144, a second branch 146, and a third branch 148. The bodies 142 of the common electrodes 140 are electrically connected to the scanning driver 190. As such, each of the common electrodes 140 has the separated first, second, and third branches 144, 146, and 148 arranged between the two continuous rows of the EL array 120. Specifically, regarding a connection relationship between the common electrodes 140 and the EL array 120, the first, second, and third branches 144, 146, and 148 of the N$^{th}$ common electrode 140 are electrically connected to the first, second, and third EL components 122, 124, and 126 in the Nth row, respectively. Similarly, the first, second, and third branches 144, 146, and 148 of the N+1$^{th}$ common electrode 140 are electrically connected to the first, second, and third EL components 122, 124, and 126 in the N+1$^{th}$ row respectively. By this way, the first, second, and third EL components 122, 124, and 126 are forward biased between the corresponding common electrode branch and segment electrode. Further, each of the first, second, and third branches 144, 146, and 148 serves as a separate common return path for the corresponding first, second, and third EL components 122, 124, and 126. As such, resistances in the return paths for EL 122, 124, and 126 are largely isolated from one another. This in turn reduces the effect of the varying return path voltages seen by the EL components of different types.

As discussed previously, EL components with different types may require different pre-charge voltages. Accordingly, if nodes of EL components of different types are connected to the same common return path, these EL components affect each other during the voltage or current drive stage.

In this regard, since nodes of the first, second, and third EL components 122, 124, and 126 are connected to their corresponding separate common return paths respectively, this prevents the first, second, and third EL components 122, 124, and 126 from affecting each other during the voltage or current drive stage. Currents flowing through the first EL components 122 to the first common electrode branches 144 are prevented from passing to the second or third branches 146 and 148. As such, currents received by the first, second, and third EL components 122, 124, and 126 in the same row (e.g., in the N$^{th}$ row) of the EL array 120 can be substantially maintained at the respective predefined currents.

Moreover, since each of the common return paths is constructed for EL components with the same color, the EL components that are electrically connected to the same branch are easier to be controlled to provide substantially uniform brightness, thereby further minimizing the white balance shift. For example, in embodiments involving with that the first EL components 122 being red LEDs that are electrically connected to the same first branch 144, the red LEDs may provide red light with substantially uniform brightness. To illustrate, there are nodes VG1 and VG1' of the first branch 144. Even though voltages at nodes VG1 and VG1' of the first branch 144 might be slightly different, it is feasible to compute the compensation for the difference (or e.g., much more achievable than under the circuit model as shown in FIG. 1C) because the first branch is arranged only for connecting the same color LEDs (e.g., red LEDs). Similarly, it is feasible to compute the compensation for the voltage difference between nodes VG2 and VG2' of the second branch 146 or between nodes VG3 and VG3' of the third branch 148 as well, thereby further minimizing the white balance shift.

The arrangement of each common electrode having more than one branches and each branch is electrically connected with one type of EL component that provides separate parallel common return paths for the different types of the EL components in the same row allows different pre-charge voltages for different types of the EL components in the same row. By arranging different types of EL components, such as red, green, and blue LEDs, in which the different types of the LEDs in the same row are electrically connected to their corresponding branches respectively, thereby individually controlling the different-color LEDs can be controlled individually to minimize white balance shift. Therefore, in accordance to a second aspect of the present invention, provided is a scheme of supplying pre-charging voltages of different predefined values during the voltage drive stage of the display scanning operation; wherein the different predefined pre-charging voltage values are determined according to the electrical response characteristics of the different types of EL components.

In another embodiment, the display panel comprising an EL array is provided by arranging EL components of the same type, such as blue LEDs, and disposing different types of quantum dots, such that red, green, and blue quantum dots, above the LEDs, and that the LEDs are configured to excite the different types of the quantum dots. The LEDs can be divided into more than one groups for exciting the different color quantum dots, and the groups are electrically connected to the their corresponding branches of the same common electrode respectively, so to allow the individual control of the LEDs of the different groups to match the different quantum dots, similar to that in the above-described embodiment.

The following further explains the solution to the aforementioned problem provided by the first aspect of the present invention. Again referring to FIG. 1A. The VI characteristics of the red, green, and blue LEDs are different in two ways:

(a) The threshold voltages are different. This is the reason that different pre-charge voltages for the red, green, and blue LEDs are needed. But, using different pre-charge voltages cannot completely resolve the problem since the pre-charge voltages cannot be set equal to the threshold voltages; they must be set lower than the threshold voltages with some margin to ensure LEDs are not turned ON before the current drive stage.

(b) The VI response slopes are different. For example, the slope of a blue LED is steeper than that of a green LED. This means a blue LED is more sensitive to voltage change. If a driving current of 50 uA is driven to the blue LED, then the delta voltage elevation is: 2.70V−2.45V=0.25V. On the other hand, the same 50 uA driving current for green LED, the delta voltage elevation is: 2.70V−2.20V=0.50V. This difference in delta voltage elevations increases the total electrical charge absorbed by the junction capacitors (e.g., the reverse biased LEDs). Thus, there is more current passing through the blue LED than the green LED at the initial current drive stage.

In the circuit model of a conventional LED passive matrix display, the different color LEDs are sharing the same common electrode, where there exists certain degree of resistance. In this case, for example, during the initial stage when both the blue and green LEDs are turned ON, current is flowing to the common electrode, and causes the voltage ground GND level at the common electrode to rise. The blue and green LEDs, hence, need additional delta voltage elevations to maintain the current increase (e.g., from 0 uA to 50 uA). Blue LED needs a smaller delta voltage elevation to increase current. Thus, the blue LED current increases faster than green LED and injects more current to the common electrode, raising the voltage ground GND level at the common electrode further. The result is the suppression of current passing through the green LED and in turn its brightness. In essence, this is the problem being solved by the first aspect of the present invention that proposes the circuit models that electrically group the fast acting EL components (e.g., blue LEDs) together, but separate from the slow acting EL components.

The proposed circuit models that electrically group the fast acting EL components together, but separate from the slow acting EL components also resolve the aforementioned issue of pre-charge voltage being lower than the threshold voltage. Recall that the pre-charge voltage must be set lower than the threshold voltages with some margin ($V_m$) to ensure LEDs are not turned ON before the current drive stage. In practice, due to the 'lot-to-lot' variations in the manufacturing process, $V_m$ for red LEDs ($V_m^r$), $V_m$ for green LEDs ($V_m^g$), and $V_m$ for blue LEDs ($V_m^b$) cannot be set equal easily. Therefore, in the conventional display panel, one of the color LED may turn ON earlier than the others and the common electrode resistance effect as described above applies. In the circuit model proposed by the first aspect of the present invention, on the other hand, by separating the common electrode into three branches and electrically grouping the same color LEDs to their respective common electrode branches, the group of LEDs with smaller $V_m$ may compete within themselves for the driving current first, and the group of LEDs with larger $V_m$ may compete within themselves later but without intervention by the faster group of LEDs. As such, the different-color LEDs can be controlled individually to minimize white balance shift.

Figure 2C:
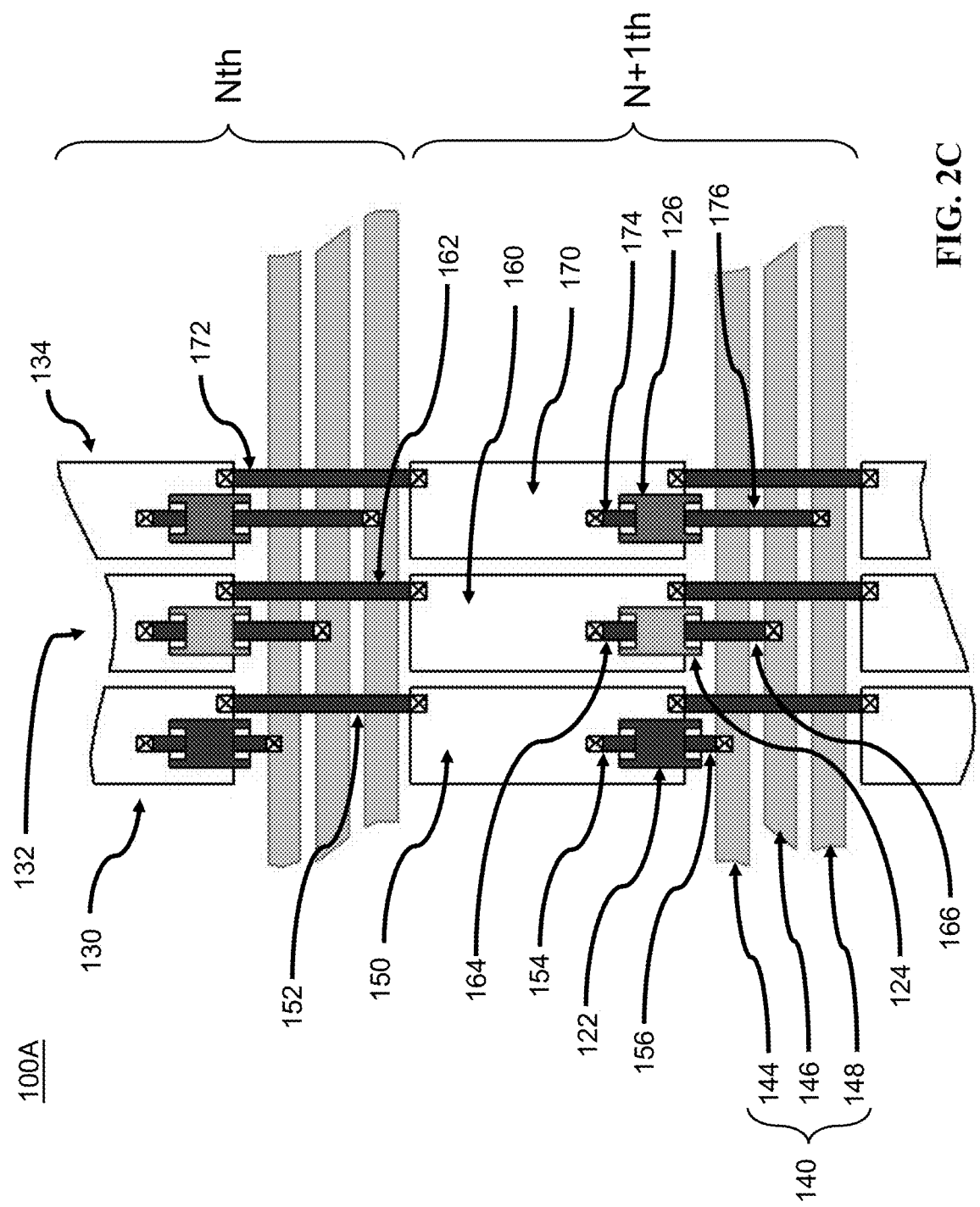
FIG. 2C illustrates a further structural diagram of the configuration in FIG. 2B.

In accordance to another embodiment of the first aspect of the present invention, the passive matrix display 100A that includes the common electrodes 140 having the first, second, and third branches 144, 146, and 148 can be applied to a translucent or transparent display panel, which may in turn be assembled to a window, such as a car windshield. In this embodiment, the first, second, and third branches 144, 146, and 148 are made of metal with an ITO (indium tin oxide) coating and are designed with suitable dimension to avoid reducing the aperture ratio of the passive matrix display 100A. Reference is made to FIG. 2C that further illustrates the structural diagram of the configuration in FIG. 2B under this embodiment. Each of the first, second, and third signal lines 130, 132, and 134 includes a plurality of transparent ITO strips and a plurality of signal bridges.

The first signal line 130 includes a plurality of first transparent ITO strips 150 and a plurality of first signal bridges 152. The first transparent ITO strips 150 are arranged in line and alternately with the common electrodes 140. In one embodiment, the number of the first transparent ITO strips 150 is the same as that of the common electrodes 140, and the N number of the first transparent ITO strips 150 are arranged in line. In the exemplary illustration of FIG. 2C, from top to bottom, shown are the Nth first transparent ITO strip 150, the Nth row common electrode 140, the N+1th first transparent ITO strip 150, and the N+1th row common electrode 140. Each of the first signal bridges 152 are arranged to extend across the first, second, and third branches 144, 146, and 148 of the corresponding common electrode 140, so as to electrically connect the adjacent two of the first transparent ITO strips 150. Therefore, the plurality of the first transparent ITO strips 150 are electrically connected together, such that a current flowing from the signal driver (see FIG. 2A) is fed to one of the first transparent ITO strips 150 of the first signal line 130. The first signal bridges 152 are metal bridges above the first transparent ITO strips 150, in which the metal bridges are separated from the first transparent ITO strips 150 by isolation dielectric layers and are electrically connected to the first transparent ITO strips 150 by vias in the isolation dielectric layers.

A relationship arrangement among the N+1$^{th}$ first transparent ITO strip 150, the N+1$^{th}$ row common electrode 140, and the first EL component 122 in the N+1$^{th}$ row are provided as followed, and such relationship arrangement can be applied to combinations of the first transparent ITO strips 150, the common electrodes 140, and the first EL components 122 in other rows (e.g., in the N$^{th}$ row). As viewed in a direction normal to the passive matrix display 100A, the first EL component 122 may partially overlap with the first transparent ITO strips 150 and separated from the first branches 144 of the common electrodes 140. Furthermore, an area of one of the first EL components 122 is less than an area of one of the first transparent ITO strips 150 such that regions of the passive matrix display 100A corresponding to the first transparent ITO strips 150 provides a transparent visual effect due to the transparency of the first transparent ITO strips 150, which is advantageous in assembling the passive matrix display 100A into a window display.

In one embodiment, the passive matrix display 100A further includes a plurality of first segment bridges 154 electrically connecting corresponding pairs of the first transparent ITO strips 150 and the first EL components 122 and includes a plurality of first common bridges 156 electrically connecting corresponding pairs of the common electrodes 140 and the first EL components 122. For example, the first EL component 122 in the N+1$^{th}$ row may have an anode, a cathode, and a light-emitting layer (e.g., an organic compound layer) between the anode and cathode. The first segment bridge 154 electrically connected to the N+1$^{th}$ first transparent ITO strip 150 is electrically connected one of the anode and the cathode, and the first common bridge 156 electrically connected to the first branch 144 of the N+1$^{th}$ row common electrode 140 is electrically connected another one of the anode and the cathode. Accordingly, the N+1$^{th}$ first transparent ITO strip 150 and the first branch 144 of the N+1$^{th}$ row common electrode 140 can be collectively configured to apply a bias (e.g., a forward bias) to the light-emitting layer of the first EL component 122 in the N+1$^{th}$ row. In various embodiments, the first segment bridges 154 are metal bridges that are separated from the first transparent ITO strips 150 by an isolation dielectric layer and are electrically connected to the first transparent ITO strips 150 by vias in the isolation dielectric layer. The first common bridges 156 are metal bridges that are separated from the common electrodes 140 by an isolation dielectric layer and are electrically connected to the common electrodes 140 by vias in the isolation dielectric layer.

The second signal line 132 has an arrangement similar or identical to that of the first signal line 130. For example, the second signal line 132 includes a plurality of second transparent ITO strips 160 and a plurality of second signal bridges 162 arranged in line. Moreover, a relationship arrangement among the second transparent ITO strips 160, the common electrode 140, and the second EL components 124 is similar or identical to the relationship arrangement among the first transparent ITO strips 150, the common electrode 140, and the first EL components 122. For example, the passive matrix display 100A further includes a plurality of second signal bridges 164 and a plurality of second common bridges 166 electrically connected to the corresponding second EL components 124, so as to apply a bias (e.g., a forward bias) to the second EL components 124 by the second transparent ITO strips 160 and the second branches 146 of the common electrodes 140 collectively.

Furthermore, since the first and second branches 144 and 146 of the same common electrode 140 are arranged in a direction perpendicular to the extending direction thereof, each of the second common bridges 166 may extend across the corresponding first branch 144. For example, the second common bridge 166 electrically connecting the second EL component 124 in the N+1$^{th}$ row and the second branch 146 of the N+1 row common electrode 140 extends across the first branch 144 of the N+1 row common electrode 140 and thus has a length greater than a length of each of the first common bridges 156.

The third signal line 134 has an arrangement similar or identical to that of the first signal line 130. For example, the third signal line 134 includes a plurality of third transparent ITO strips 170 and a plurality of third signal bridges 172 arranged in line. Moreover, a relationship arrangement among the third transparent ITO strips 170, the common electrode 140, and the third EL components 126 is similar or identical to the relationship arrangement among the first transparent ITO strips 150, the common electrode 140, and the first EL components 122. For example, the passive matrix display 100A further includes a plurality of third signal bridges 174 and a plurality of third common bridges 176 electrically connected to the corresponding third EL components 126, so as to apply a bias (e.g., a forward bias) to the third EL components 126 by the third transparent ITO strips 170 and the third branches 148 of the common electrodes 140 collectively. Similarly, since the first, second, and third branches 144, 146, and 148 of the same common electrode 140 are arranged in a direction perpendicular to the extending direction thereof, each of the third common bridges 148 may extend across the corresponding first and second branches 144 and 146. For example, the third common bridge 176 electrically connecting the third EL component 126 in the N+1$^{th}$ now and the third branch 148 of the N+1 row common electrode 140 extends across the first and second branches 144 and 146 of the N+1 row common electrode 140 and thus has a length greater than the length of each of the first and second bridges 156 and 166.

Figure 3:
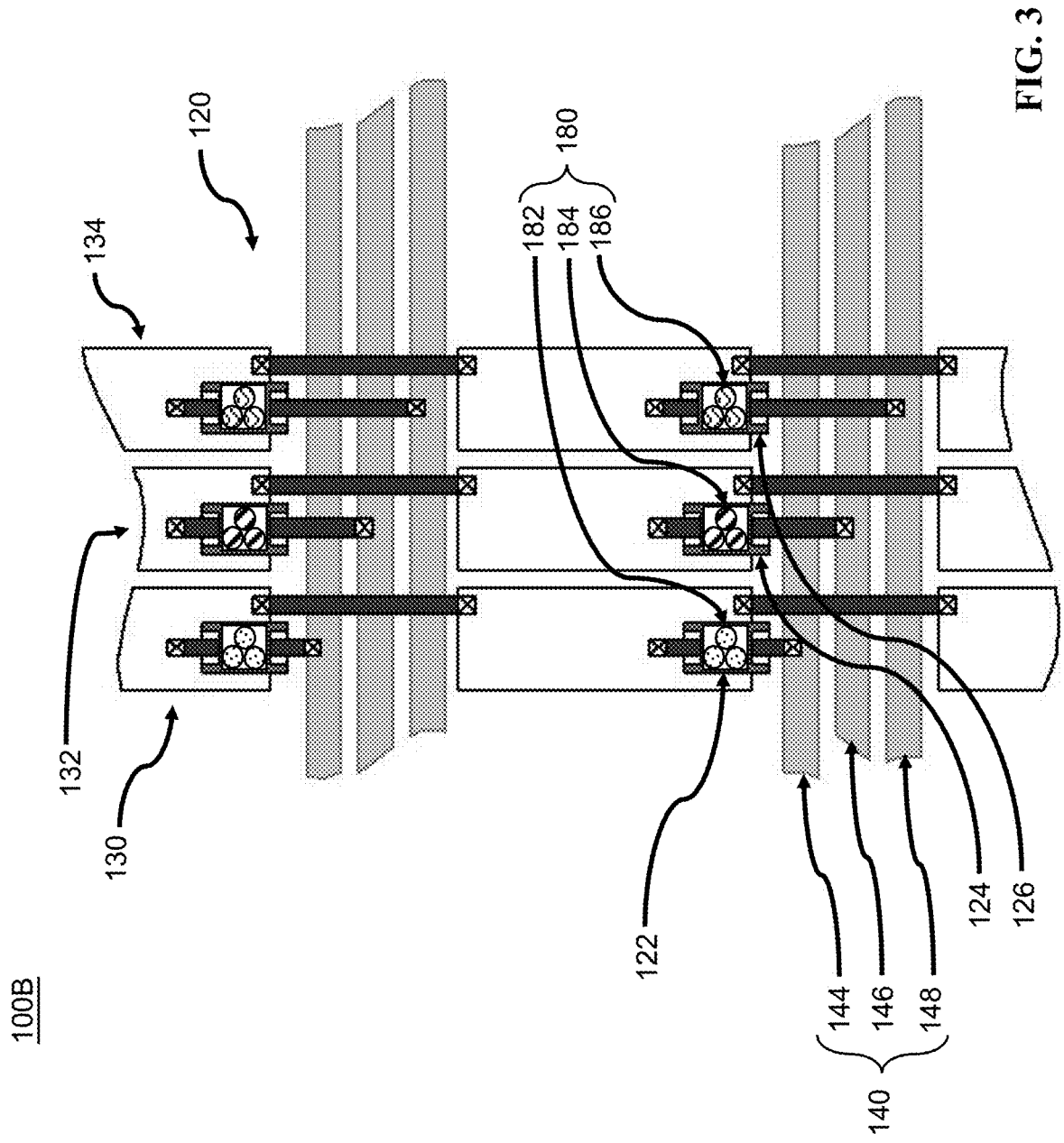
FIG. 3 illustrates a structural diagram of a partial configuration of a passive matrix display in accordance with a second embodiment of the present invention.

Reference is made to FIG. 3 illustrating a structural diagram of a partial configuration of a passive matrix display 100B in accordance with a second embodiment of the present invention. Many aspects of the passive matrix display 100B of the present embodiment are similar or identical to those of the passive matrix display 100A of the first embodiment, as shown by the repeated reference numerals. For example, the passive matrix display 100B also includes first, second, and third EL components 122, 124, and 126 arranged into an EL array 120, first, second, and third signal lines 130, 132, and 134 including transparent segment electrodes and arranged in parallel to each other, common electrodes 140 alternately arranged with the rows of the EL array 120 and having first, second, and third branches 144, 146, and 148.

At least one difference between the second embodiment and the first embodiment is that the passive matrix display 100B further includes a wavelength-converting layer 180 partially covering the EL array 120. The wavelength-converting layer 180 is configured to convert light providing from the EL array 120 into light with different wavebands. Specifically, the wavelength-converting layer 180 may include a plurality of first quantum dots 182 overlapping with the first EL components 122, a plurality of second quantum dots 184 overlapping with the second EL components 124, a plurality of third quantum dots 186 overlapping with the third EL components 126. Herein, the quantum dots overlapping with the corresponding EL components may be achieved by disposing the quantum dots above the corresponding EL components. The first, second, and third quantum dots 182, 184, and 186 can be excited by the first, second, and third EL components 122, 124, and 126 respectively, to provided light in different wavebands, such as red, green, and blue wavebands.

In various embodiments, the first, second, and third EL components 122, 124, and 126 are deployed to provide light in the same waveband. For example, the first, second, and third EL components 122, 124, and 126 maybe blue LEDs. In this regard, for a single row of the EL array 120, since the first, second, and third EL components 122, 124, and 126 are electrically connected to the first, second, and third branches 144, 146, and 148 of the same common electrode 140 respectively, the first, second, and third EL components 122, 124, and 126 can be driven by current with different values, which will be advantageous to match the electrical response characteristics of the different quantum dots. That is, during the display operation of the passive matrix display 100B, the first, second, and third EL components 122, 124, and 126 may provide light in the same waveband but with different brightness levels. In other embodiments, in order to match the electrical response characteristics of the different quantum dots, the first, second, and third EL components 122, 124, and 126 may be deployed to provide light in different wavebands. Furthermore, in some embodiments, the quantum dots of the wavelength-converting layer 180 can be replaced by different color filter layers, such as red, green, and blue color filter layers, which will be advantageous to purify light provided by the first, second, and third EL components 122, 124, and 126.

The above-described embodiments of the present invention are illustrated primarily by LED passive matrix display panels utilizing red, green, and blue LEDs, and thus being applied by a circuit model having three separate branches of common electrode each for connecting one of the colors LEDs in the LED array. An ordinarily skilled person in the art should appreciate that embodiments of the present invention can be modified to accommodate and be applied to display panels utilizing more than three colors LEDs. In such cases, the number of separate branches of common electrode is adjusted to match the number of different LED colors in the circuit model. Still in other applications, there may be unequal number of different color LEDs being utilized in a LED array. For example, there may be one red, one green, and two blue LEDs in each group. In this case, the circuit model can also be adapted by having four separate branches of common electrode, one for connecting the red LEDs, one for the green LEDs, and two for the two sets of blue LEDs for each row of the LED array. Similarly, other examples include, but not limited to, four separate branches of common electrode connecting red, yellow, green, and blue LEDs; red, green, blue, and white LEDs; and red, green, cyan, and blue LEDs; and red, red, green, and blue LEDs.

The electronic embodiments disclosed herein may be implemented using computing devices, computer processors, or electronic circuitries including but not limited to application specific integrated circuits (ASIC), field programmable gate arrays (FPGA), and other programmable logic devices configured or programmed according to the teachings of the present disclosure. Computer instructions or software codes running in the general purpose or specialized computing devices, computer processors, or programmable logic devices can readily be prepared by practitioners skilled in the software or electronic art based on the teachings of the present disclosure.

All or portions of the electronic embodiments may be executed in one or more computing devices including server computers, personal computers, laptop computers, mobile computing devices such as smartphones and tablet computers.

The electronic embodiments include computer storage media having computer instructions or software codes stored therein which can be used to program computers or microprocessors to perform any of the processes of the present invention. The storage media can include, but are not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

Various embodiments of the present invention also may be implemented in distributed computing environments and/or Cloud computing environments, wherein the whole or portions of machine instructions are executed in distributed fashion by one or more processing devices interconnected by a communication network, such as an intranet, Wide Area Network (WAN), Local Area Network (LAN), the Internet, and other forms of data transmission medium.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. A LED display, comprising:
   a plurality of first electroluminescent (EL) components;
   a plurality of second EL components;
   a plurality of third EL components, wherein the first, second, and third EL components collectively form an EL array with K rows, and K is a positive integer greater than 1;
   a first segment electrode extending to electrically connect the first EL components;
   a second segment electrode extending to electrically connect the second EL components;
   a third segment electrode extending to electrically connect the third EL components; and
   a plurality of common electrodes alternately arranged with the rows of the EL array, wherein each of the common electrodes has a first branch, a second branch, and a third branch, the first, second, and third branches of the $N^{th}$ common electrode of the common electrodes are electrically connected to the first, second, and third EL components in the $N^{th}$ row of the EL array respectively, the first, second, and third branches of the $N+1^{th}$ common electrode of the common electrodes are electrically connected to the first, second, and third EL components in the $N+1^{th}$ row of the EL array respectively, and N is a positive integer less than K.

2. The LED display of claim 1, wherein each of the common electrodes further has a body, and the first, second, and third branches of each of the common electrodes extend along a first direction from the body and are arranged in a second direction perpendicular to the first direction.

3. The LED display of claim 2, wherein the first segment electrode comprises:
   a plurality of first segment electrodes arranged to partially overlap with the first EL components respectively; and
   a plurality of first signal bridges electrically connected to the first segment electrodes, wherein each of the first signal bridges connects adjacent two of the first segment electrodes and extends across the first, second, and third branches of the same common electrode;
   wherein the second segment electrode comprises:
   a plurality of second segment electrodes arranged to partially overlap with the second EL components respectively; and
   a plurality of second signal bridges electrically connected the second segment electrodes, wherein each of the second signal bridges connects adjacent two of the second segment electrodes and extends across the first, second, and third branches of the same common electrode;
   wherein the third segment electrode comprises:
   a plurality of third segment electrodes arranged to partially overlap with the third EL components respectively; and
   a plurality of third signal bridges electrically connected the third segment electrodes, wherein each of the third signal bridges connects adjacent two of the third segment electrodes and extends across the first, second, and third branches of the same common electrode.

4. The LED display of claim 3, the first, second, and third segment electrodes are transparent.

5. The LED display of claim 1, further comprising:
   a plurality of first common bridges electrically connecting the first EL components and the first branches of the common electrodes;
   a plurality of second common bridges electrically connecting the second EL components and the second branches of the common electrodes and extending across the first branches of the common electrodes, wherein each of the second common bridges has a length greater than a length of each of the first common bridges; and
   a plurality of third common bridges electrically connecting the third EL components and the third branches of the common electrodes and extending across the first and second branches of the common electrodes, wherein each of the third common bridges has a length greater than those of the first and second common bridges.

6. A light-emitting diode (LED) display, comprising:
   a first electroluminescent (EL) component;
   a second EL component;
   a third EL component;
   a first segment electrode electrically connected to the first EL component;
   a second segment electrode electrically connected to the second EL component;
   a third segment electrode electrically connected to the third EL component; and
   a first common electrode having a first branch, a second branch, and a third branch which extend along a first direction and are arranged in a second direction different than the first direction, wherein the first branch is located between the second branch and either of the first and second EL components, the second branch is located between the first and third branches, and the first, second, and third branches are electrically connected to the first, second, and third EL components, respectively.

7. The LED display of claim 6, further comprising one or more signal drivers configured to supply a first pre-charge voltage to the first EL component, a second pre-charge voltage to the second EL component, and a third pre-charge voltage to the third EL component;
wherein the first pre-charge voltage is at a voltage value determined based on the first EL component's electrical response characteristics;
wherein the second pre-charge voltage is at a voltage value determined based on the second EL component's electrical response characteristics; and
wherein the third pre-charge voltage is at a voltage value determined based on the third EL component's electrical response characteristics.

8. The LED display of claim 6, wherein the first common electrode has a body, and the first, second, and third branches extend from the same body.

9. The LED display of claim 6, wherein the first EL component viewed in a direction normal to the LED display partially overlaps with the first segment electrode.

10. The LED display of claim 9, wherein an area of the first EL component viewed in the direction is less than an area of the first segment electrode viewed in the direction.

11. The LED display of claim 6, wherein the first, second, and third segment electrodes are transparent.

12. The LED display of claim 6, further comprising:
a first common bridge electrically connecting the first EL component and the first branch which are separated from each other as viewed in a direction normal to the LED display.

13. The LED display of claim 12, further comprising:
a second common bridge electrically connecting the second EL component and the second branch which are separated from each other as viewed in the direction, wherein the first and second common bridges have different lengths.

14. The LED display of claim 13, wherein the second common bridge extends across the first branch.

15. The LED display of claim 13, further comprising:
a third common bridge electrically connecting the third EL component and the third branch which are separated from each other as viewed in the direction, wherein the third common bridge has a length different from the lengths of the first and second common bridges.

16. The LED display of claim 15, wherein the third common bridge extends across the first and second branches.

17. The LED display of claim 6, wherein the first EL component is configured to provide light in a first waveband, the second EL component is configured to provide light in a second waveband, the third EL component is configured to provide light in a third waveband, and the first, second, and third wavebands are different.

18. The LED display of claim 6, wherein the first, second, and the third EL components are configured to provide light in the same waveband, and the LED display further comprises:
a wavelength-converting layer comprising a plurality of first quantum dots above the first EL component, a plurality of second quantum dots above the second EL component, and a plurality of third quantum dots above the third EL component, wherein the first, second, and third quantum dots are configured to provide light in different wavebands.

19. The LED display of claim 6, wherein the first, second, and third EL components are light-emitting diodes (LEDs) configured to provide light in different wavebands respectively and are selected from a group consisting of a red LED, a green LED, and a blue LED.

20. The LED display of claim 6, further comprising:
a second common electrode having a plurality of branches, wherein the first, second, and third EL components are arranged along the first direction and are between the first and second common electrodes.

* * * * *